United States Patent
Sato (10) Patent No.: US 9,132,497 B2
(45) Date of Patent: Sep. 15, 2015

(54) VISCOUS MATERIAL FEEDER AND VISCOUS MATERIAL PRINTER

(71) Applicant: YAMAHA HATSUDOKI KABUSHIKI KAISHA, Shizuoka-ken (JP)

(72) Inventor: Hidetoshi Sato, Shizuoka-ken (JP)

(73) Assignee: Yamaha Hatsudoki Kabushiki Kaisha, Shizuoka-ken (JP)

( * ) Notice: Subject to any disclaimer, the term of this patent is extended or adjusted under 35 U.S.C. 154(b) by 241 days.

(21) Appl. No.: 13/829,809

(22) Filed: Mar. 14, 2013

(65) Prior Publication Data

US 2014/0117067 A1    May 1, 2014

(30) Foreign Application Priority Data

Oct. 26, 2012  (JP) ................................ 2012-236881

(51) Int. Cl.
| | |
|---|---|
| *B41F 15/40* | (2006.01) |
| *B23K 3/06* | (2006.01) |
| *H05K 3/12* | (2006.01) |
| *H05K 3/34* | (2006.01) |

(52) U.S. Cl.
CPC ............ *B23K 3/0638* (2013.01); *B41F 15/40* (2013.01); *H05K 3/1233* (2013.01); *H05K 3/3484* (2013.01); *H05K 2203/0126* (2013.01)

(58) Field of Classification Search
CPC ........... B23K 3/06; B23K 3/0638; H05K 3/34
USPC ........... 101/123, 124, 119, 114; 118/406, 413
See application file for complete search history.

(56) References Cited

U.S. PATENT DOCUMENTS

| | | | |
|---|---|---|---|
| 6,423,141 | B1 * | 7/2002 | Lin et al. .................. 118/413 |
| 6,813,820 | B2 * | 11/2004 | Nelson et al. ............... 29/527.4 |
| 8,342,381 | B2 | 1/2013 | Sumioka |
| 2004/0080075 | A1 | 4/2004 | Pekurovsky et al. |
| 2008/0040908 | A1 | 2/2008 | Pekurovsky et al. |
| 2008/0041305 | A1 | 2/2008 | Pekurovsky et al. |
| 2010/0084828 | A1 | 4/2010 | Tatsuda et al. |
| 2012/0138664 | A1 | 6/2012 | Sumioka |

FOREIGN PATENT DOCUMENTS

| | | |
|---|---|---|
| EP | 1556174 B1 | 12/2009 |
| JP | 2006-266358 A | 10/2006 |

(Continued)

OTHER PUBLICATIONS

An Office Action issued by the Korean Patent Office on Aug. 12, 2014, which corresponds to Korean Patent Application No. 10-2013-0037944 and is related to U.S. Appl. No. 13/829,809.
The extended European search report issued on Apr. 8, 2014, which corresponds to European Patent Application No. 13001886.4-1704 and is related to U.S. Appl. No. 13/829,809.

(Continued)

*Primary Examiner* — Leslie J Evanisko
(74) *Attorney, Agent, or Firm* — Studebaker & Brackett PC (57) ABSTRACT

This viscous material feeder includes a nozzle to discharge a viscous material stored in a storage portion storing the viscous material and a feeding mechanism transferring the viscous material from the storage portion to the nozzle and discharging the viscous material from the nozzle. The nozzle has a bent feed route to guide the viscous material from the storage portion to a tip of the nozzle and is configured to be dividable along the bent feed route.

19 Claims, 7 Drawing Sheets

(56) References Cited

FOREIGN PATENT DOCUMENTS

| | | |
|---|---|---|
| JP | 2010-179628 A | 8/2010 |
| JP | 4643719 B2 | 12/2010 |
| KR | 2009-0104816 A | 10/2009 |
| KR | 2011-0033298 A | 3/2011 |
| WO | 01/07254 A1 | 2/2001 |

OTHER PUBLICATIONS

An Office Action; "Notification of First Office Action," issued by the State Intellectual Property Office of the People's Republic of China on May 4, 2015, which corresponds to Chinese Patent Application No. 201310177714.5 and is related to U.S. Appl. No. 13/829,809; with English language translation.

* cited by examiner

FIG.9  SECTIONAL VIEW ALONG LINE 500-500

VISCOUS MATERIAL FEEDER AND VISCOUS MATERIAL PRINTER

CROSS-REFERENCE TO RELATED APPLICATION

The priority application number JP2012-236881, Viscous Material Feeder and Viscous Material Printer, Oct. 26, 2012, Hidetoshi Sato, upon which this patent application is based is hereby incorporated by reference.

BACKGROUND OF THE INVENTION

1. Field of the Invention

The present invention relates to a viscous material feeder and a viscous material printer, and more particularly, it relates to a viscous material feeder including a nozzle to discharge a viscous material and a viscous material printer including such a viscous material feeder.

2. Description of the Background Art

A viscous material feeder including a nozzle to discharge a viscous material and a viscous material printer including such a viscous material feeder are known in general. Such a viscous material feeder is disclosed in Japanese Patent Laying-Open No. 2010-179628, for example.

Japanese Patent Laying-open no. 2010-179628 discloses a solder printer including a solder feeder feeding solder (viscous material) onto a surface of a mask and a squeegee scraping off the solder fed onto the surface of the mask. The solder feeder of this solder printer includes a container storing the solder, a discharge adapter attached to an opening of the container, a feed mechanism to feed the solder from the container, a guide block formed with a solder flow path, and a feed port discharging the solder at a tip of the guide block. The solder flow path of the guide block is formed to extend obliquely, and the solder flow path in the feed port at the tip of the guide block is formed to extend vertically. Thus, the solder feeder according to Japanese Patent Laying-open no. 2010-179628 has a bent feed route to feed the solder by the guide block and the feed port.

In the solder feeder, the solder, which is a viscous material, is likely to remain in the feed route and hardens with time, and hence it is necessary to clean the feed route during maintenance. However, the solder feeder according to Japanese Patent Laying-open no. 2010-179628 has the bent feed route, so that a bar-shaped cleaning tool hardly passes through a bent portion of the feed route when the bar-shaped cleaning tool is inserted into the feed route for cleaning, for example. Furthermore, in the case of the bent feed route, the interior portion (portion farther than the bent portion) of the feed route cannot be checked from outside, and hence the cleaning state of the feed route (whether or not the solder remains in the feed route) cannot be checked. Therefore, there is room for improvement in the solder feeder according to Japanese Patent Laying-open no. 2010-179628 in terms of inhibiting the solder (viscous material) from remaining in the feed route during maintenance of the printer and cleaning workability during maintenance of the printer.

SUMMARY OF THE INVENTION

The present invention has been proposed in order to solve the aforementioned problem, and an object of the present invention is to provide a viscous material feeder capable of inhibiting a viscous material from remaining in a feed route by improving cleaning workability in the feed route during maintenance and a viscous material printer including such a viscous material feeder.

In order to attain the aforementioned object, a viscous material feeder according to a first aspect of the present invention includes a nozzle to discharge a viscous material stored in a storage portion storing the viscous material and a feeding mechanism transferring the viscous material from the storage portion to the nozzle and discharging the viscous material from the nozzle, while the nozzle has a bent feed route to guide the viscous material from the storage portion to a tip of the nozzle and is configured to be dividable along the bent feed route.

As hereinabove described, the viscous material feeder according to the first aspect of the present invention is provided with the nozzle having the bent feed route to guide the viscous material from the storage portion to the tip of the nozzle and configured to be dividable along the bent feed route, whereby during maintenance, the feed route can be cleaned in a state where the nozzle is divided along the bent feed route to expose the feed route. Thus, even the feed route having a bent portion can be easily cleaned, and hence cleaning workability in the feed route during maintenance can be improved, and the cleaning state of the feed route can be checked to inhibit the viscous material from remaining in the feed route.

In the aforementioned viscous material feeder according to the first aspect, the bent portion of the bent feed route of the nozzle is preferably formed in a smoothly curved shape. According to this structure, even in the structure of providing the bent feed route in the nozzle, the bent portion is not bent sharply so that increase in viscous material flow resistance in viscous material feeding can be suppressed. Consequently, even in the structure of providing the bent feed route in the nozzle, increase in a load on the feeding mechanism discharging the viscous material (power necessary to feed the viscous material) can be suppressed. Furthermore, the bent portion is not bent sharply, and hence a corner portion thereof can be easily cleaned. Thus, cleaning workability can be improved.

In this case, the feed route of the nozzle preferably includes a straight passage portion formed in a linear manner and continuing from an entrance portion, and the straight passage portion preferably extends along the feeding direction of the viscous material fed from the storage portion to the entrance portion. According to this structure, in the straight passage portion, the feeding direction of the viscous material fed from the entrance portion is not changed, and hence the viscous material can be smoothly injected into the entrance portion (a connection portion between the nozzle and an external portion).

In the aforementioned structure having the feed route including the straight passage portion, the straight passage portion preferably has such a shape that an end portion thereof closer to the entrance portion widens toward the entrance portion. According to this structure, the feed route widens at the entrance portion (the connection portion between the nozzle and the external portion), and hence the viscous material can be more smoothly injected into the entrance portion.

In the aforementioned structure having the feed route including the straight passage portion, the feed route of the nozzle preferably further includes an inclined passage portion connected to the straight passage portion and inclined with respect to the straight passage portion, and the inclined passage portion preferably linearly extends obliquely downward from a portion connecting to the straight passage portion toward an exit portion. According to this structure, as compared with a case where an arcuate inclined passage portion is provided, for example, a feed path of the viscous material to the exit portion can be reduced, and hence increase in viscous material flow resistance with increase in the feed path length of the viscous material can be suppressed.

In this case, the straight passage portion and the inclined passage portion are preferably connected by the bent portion formed in the smoothly curved shape. According to this structure, increase in viscous material flow resistance in a connection portion between the straight passage portion and the inclined passage portion can be suppressed.

In the aforementioned structure having the feed route including the inclined passage portion, the feed route of the nozzle preferably further includes an exit passage portion extending linearly along the discharging direction of the viscous material discharged from the exit portion, and the inclined passage portion and the exit passage portion are preferably connected by the bent portion formed in the smoothly curved shape. According to this structure, increase in viscous material flow resistance in a connection portion between the inclined passage portion and the exit passage portion can be suppressed. Furthermore, the flow direction of the viscous material can be aligned with the discharging direction of the viscous material from the exit portion in the exit passage portion, and hence the viscous material can be smoothly discharged from the exit portion.

In the aforementioned viscous material feeder according to the first aspect, the nozzle preferably includes a first member and a second member divided along the feed route and a fixing member arranged outside the first member or the second member to attach the divided first and second members to each other. According to this structure, the feed route can be divided into two parts, and hence cleaning workability in the feed route can be improved. Furthermore, the fixing member is provided separately from the first member and the second member, whereby the first member and the second member formed with the feed route can be simplified in structure, and hence cleaning workability in the first member and the second member including the feed route can be improved.

In this case, each of the first member and the second member preferably has through-holes into which screw members are inserted, and the fixing member is preferably formed with screw holes into which the screw members passing through the through-holes of each of the first member and the second member are screwed. According to this structure, the first member and the second member are fastened together using the screw members and the fixing member, whereby the first member and the second member can be fixed to each other. Furthermore, in a case where the first member and the second member provided with the feed route are formed with the screw holes, the viscous material remaining in the feed route may partially enter the screw holes in cleaning. In this case, it is not easy to remove the viscous material entering the screw holes from the screw holes, and the screw members may be damaged by the viscous material when the viscous material such as solder hardens. In contrast, according to the present invention, the first member and the second member are formed with the through-holes, and the fixing member is formed with the screw holes. Thus, the first member and the second member provided with the feed route may be simply formed with the through-holes not the screw holes, and hence the viscous material remaining in the feed route can be prevented from partially entering the screw holes in cleaning. Consequently, cleaning workability can be improved.

In the aforementioned structure having the fixing member formed with the screw holes, a plurality of screw holes of the fixing member are preferably so formed in pairs that the screw members are arranged on both sides to sandwich the feed route therebetween. According to this structure, both sides of the feed route can be evenly fastened by pairs of screw members. Therefore, in the structure of dividing the feed route into the first member and the second member, the boundary of the feed route can be tightly fastened by a minimum necessary number of screw members.

In the aforementioned structure having the nozzle including the first member, the second member, and the fixing member, the first member preferably has a flat outer surface, and the fixing member preferably has a flat plate shape and is preferably configured to come into surface contact with the flat outer surface of the first member. According to this structure, the first member and the fixing member are brought into close contact (surface contact) with each other, whereby the first member and the second member can be strongly fixed to the fixing member. Furthermore, the fixing member is in the form of a simple flat plate, whereby assembly and disassembly of the nozzle associated with cleaning can be facilitated.

In the aforementioned structure having the nozzle including the first member, the second member, and the fixing member, the first member and the second member preferably have flat surface portions arranged in the same plane in a state where the first member and the second member are attached to each other, respectively, and the nozzle is preferably so configured that the mutual positions of the first member and the second member are determined in a state where the flat surface portions of the first member and the second member are brought into contact with a flat reference surface when the divided first and second members are attached to each other by the fixing member. According to this structure, the first member and the second member can be easily positioned with a simple structure requiring no positioning member (such as a positioning pin) separately, for example by bringing the flat surface portions into contact with the reference surface when the first member and the second member are attached to each other.

In the aforementioned viscous material feeder according to the first aspect, the bent feed route is preferably so formed that a central axis line passing through the feed route leading from an entrance portion to an exit portion at the tip is arranged in a single plane, and the nozzle is preferably configured to be dividable in half along the feed route, using the plane as a boundary. According to this structure, the entire feed route can be divided in half, and hence the feed route can be easily cleaned. The boundary surface of the divided nozzle is plat, and hence the nozzle can be easily formed with high accuracy as compared with a case where the nozzle is so divided that the boundary surface is curved, for example.

The aforementioned viscous material feeder according to the first aspect may further include a discharge adapter including a flow path causing an inner portion of the storage portion storing the viscous material and the feed route of the nozzle to communicate with each other, and the feeding mechanism may be configured to relatively move the discharge adapter and the storage portion to transfer the viscous material stored in the storage portion to the nozzle configured to be dividable through the discharge adapter.

In the aforementioned viscous material feeder according to the first aspect, the viscous material preferably includes a cream solder, a conductive paste, and an adhesive for temporarily attaching a chip. According to this structure, in the viscous material feeder feeding the viscous material such as the cream solder, the conductive paste, and the adhesive for temporarily attaching a chip employed to manufacture an electronic circuit board, cleaning workability in the feed route can be improved, and the viscous material can be inhibited from remaining in the feed route.

A viscous material printer according to a second aspect of the present invention includes a viscous material feed portion including a nozzle to discharge a viscous material stored in a storage portion storing the viscous material and a feeding mechanism transferring the viscous material from the storage portion to the nozzle and discharging the viscous material from the nozzle and a squeegee scraping off the viscous material fed by the viscous material feed portion, while the nozzle of the viscous material feed portion has a bent feed route to guide the viscous material from the storage portion to a tip of the nozzle and is configured to be dividable along the bent feed route.

As hereinabove described, the viscous material printer according to the second aspect of the present invention is provided with the viscous material feed portion including the nozzle having the bent feed route to guide the viscous material from the storage portion to the tip of the nozzle and configured to be dividable along the bent feed route, whereby during maintenance, the feed route can be cleaned in a state where the nozzle is divided along the bent feed route to expose the feed route. Thus, even the feed route having a bent portion can be easily cleaned, and hence cleaning workability in the feed route during maintenance can be improved, and the cleaning state of the feed route can be checked to inhibit the viscous material from remaining in the feed route.

In the aforementioned viscous material printer according to the second aspect, the bent portion of the bent feed route of the nozzle is preferably formed in a smoothly curved shape. According to this structure, even in the structure of providing the bent feed route in the nozzle, the bent portion is not bent sharply so that increase in viscous material flow resistance in viscous material feeding can be suppressed. Consequently, even in the structure of providing the bent feed route in the nozzle, increase in a load on the feeding mechanism discharging the viscous material (power necessary to feed the viscous material) can be suppressed. Furthermore, the bent portion is not bent sharply, and hence a corner portion thereof can be easily cleaned. Thus, cleaning workability can be improved.

In the aforementioned viscous material printer according to the second aspect, the nozzle preferably includes a first member and a second member divided along the feed route and a fixing member arranged outside the first member or the second member to attach the divided first and second members to each other. According to this structure, the feed route can be divided into two parts, and hence cleaning workability in the feed route can be improved. Furthermore, the fixing member is provided separately from the first member and the second member, whereby the first member and the second member formed with the feed route can be simplified in structure, and hence cleaning workability in the first member and the second member including the feed route can be improved.

In this case, each of the first member and the second member preferably has through-holes into which screw members are inserted, and the fixing member is preferably formed with screw holes into which the screw members passing through the through-holes of each of the first member and the second member are screwed. According to this structure, the first member and the second member are fastened together using the screw members and the fixing member, whereby the first member and the second member can be fixed to each other. Furthermore, in a case where the first member and the second member provided with the feed route are formed with the screw holes, the viscous material remaining in the feed route may partially enter the screw holes in cleaning. In this case, it is not easy to remove the viscous material entering the screw holes from the screw holes, and the screw members may be damaged by the viscous material when the viscous material such as solder hardens. In contrast, according to the present invention, the first member and the second member are formed with the through-holes, and the fixing member is formed with the screw holes. Thus, the first member and the second member provided with the feed route may be simply formed with the through-holes not the screw holes, and hence the viscous material remaining in the feed route can be prevented from partially entering the screw holes in cleaning. Consequently, cleaning workability can be improved.

In the aforementioned viscous material printer according to the second aspect, the bent feed route is preferably so formed that a central axis line passing through the feed route leading from an entrance portion to an exit portion at the tip is arranged in a single plane, and the nozzle is preferably configured to be dividable in half along the feed route, using the plane as a boundary. According to this structure, the entire feed route can be divided in half, and hence the feed route can be easily cleaned. The boundary surface of the divided nozzle is plat, and hence the nozzle can be easily formed with high accuracy as compared with a case where the nozzle is so divided that the boundary surface is curved, for example.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention is now described with reference to the drawings.

First, the structure of a printer 100 according to the embodiment of the present invention is described with reference to FIGS. 1 to 9. In this embodiment, the "viscous material printer" according to the present invention is applied to a printer printing a viscous material onto a printed board. In this embodiment, the viscous material is a viscous material employed to manufacture an electronic circuit board, and more specifically, the viscous material includes a cream solder (solder), a conductive paste (silver paste or the like, for example), an adhesive for temporarily attaching a chip, etc. In this embodiment, the solder is employed as an example of the viscous material.

Figure 1:
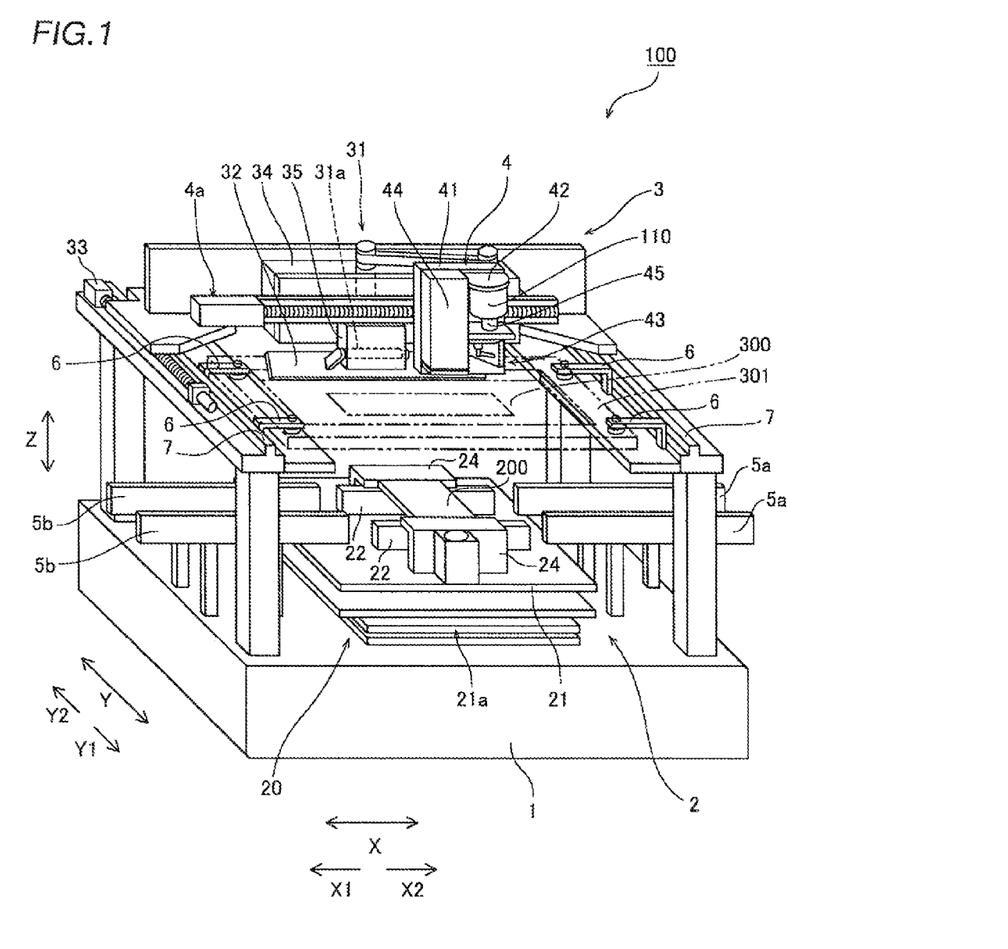
FIG. 1 is a perspective view schematically showing the overall structure of a printer according to an embodiment of the present invention.

The printer 100 according to this embodiment has a function of printing the solder onto a surface of a printed board 200 (hereinafter referred to as a "board 200") with a mask 300 formed with a plurality of openings in a prescribed pattern. The printer 100 includes a base 1, a board conveying portion 2 provided on the base 1 and conveying the board 200, a squeegee unit 3 provided above the board conveying portion 2, and a solder feed portion 4 above the board conveying portion 2, as shown in FIG. 1. The solder feed portion 4 is an example of the "viscous material feed portion" or the "viscous material feeder" in the present invention.

The board conveying portion 2 includes a pair of carrying-in conveyors 5a carrying the board 200 before printing in the printer 100 and a pair of carrying-out conveyors 5b carrying the board 200 after printing out of the printer 100, as shown in FIG. 1. The board conveying portion 2 is provided between the carrying-in conveyors 5a and the carrying-out conveyors 5b and includes a conveying support mechanism 20 conveying (delivering) and supporting the board.

The conveying support mechanism 20 includes a movable plate 21 having a rectangular shape in a plan view, a pair of conveyors 22 provided on the movable plate 21, a backup unit 23 (see FIG. 2), and a clamping mechanism 24. The conveying support mechanism 20 is configured to support the board 200 in a state where the conveyed board 200 is moved to a prescribed printing position and is positioned with respect to the mask 300.

Figure 2:
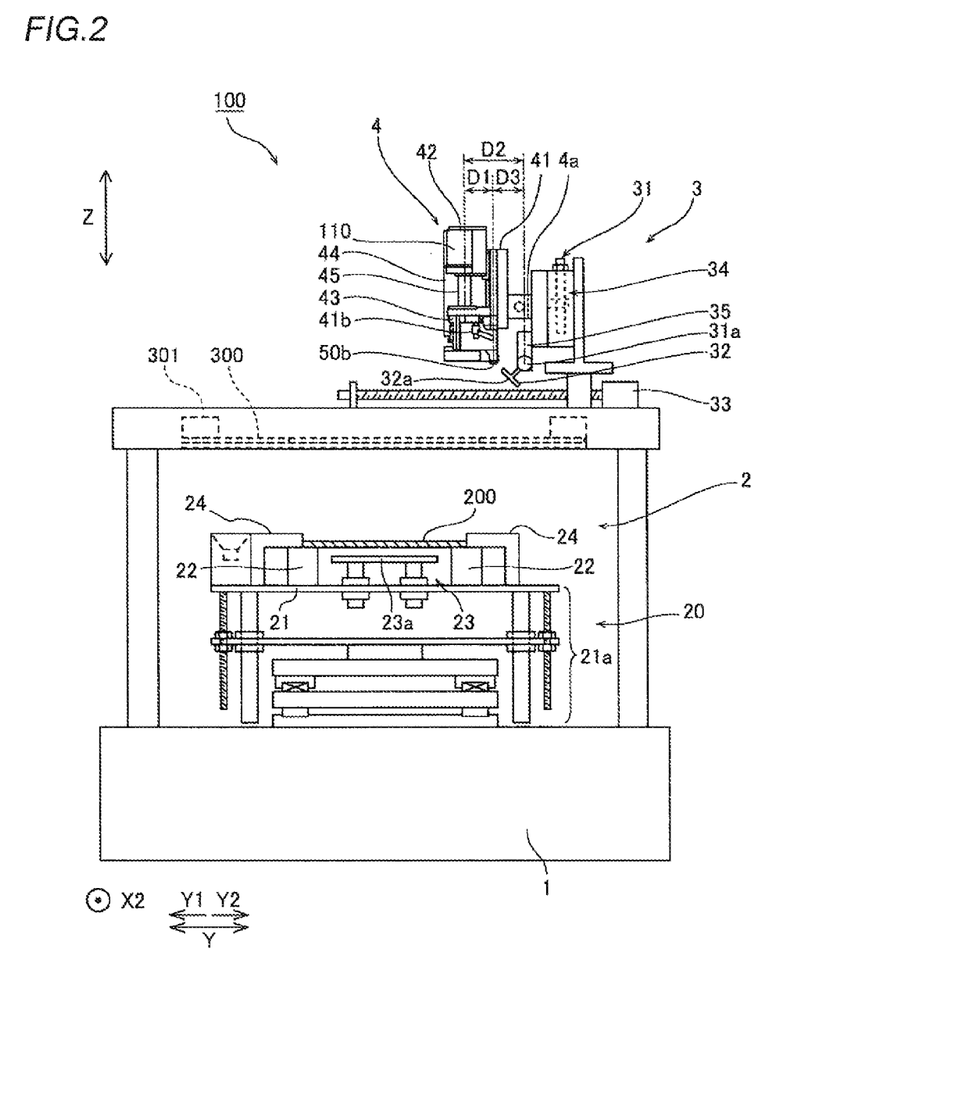
FIG. 2 is a side elevational view schematically showing the overall structure of the printer according to the embodiment of the present invention.

Specifically, the movable plate 21 is movably supported by a movement mechanism 21a, and the movement mechanism 21a is configured to be movable along orthogonal three axes (an X-axis, a Y-axis, and a Z-axis) and to be movable about a vertical axis (Z-axis), as shown in FIGS. 1 and 2. Thus, the movable plate 21 is configured to be movable in a conveying direction (direction X) of the board 200, an anteroposterior direction (direction Y) (see FIG. 2) orthogonal to the conveying direction, and a vertical direction (direction Z) and to be rotatable along a rotation direction about the vertical axis.

The pair of conveyors 22 have a function of receiving the board 200 before printing from the carrying-in conveyors 5a and conveying the board 200 after printing to the carrying-out conveyors 5b.

The backup unit 23 is placed on the movable plate 21 and is so configured that a backup plate 23a thereof is vertically movable by an unshown lifting drive portion, as shown in FIG. 2. The backup unit 23 has a function of lifting the board 200 conveyed by the pair of conveyors 22 from the conveyors 22 with a plurality of unshown backup pins attached to the backup plate 23a and moving the board 200 upward to the prescribed printing position. The board 200 moved upward to the prescribed printing position is clamped by the clamping mechanism 24. Thus, the board 200 is supported at the prescribed printing position below the mask 300.

As shown in FIG. 1, the mask 300 is formed with the plurality of openings in the prescribed pattern corresponding to application regions of the solder applied to the board 200. The mask 300 has a rectangular shape in a plan view and has a frame 301 mounted on the outer periphery thereof. The frame 301 is clamped by mask clamp portions 6, whereby the mask 300 is fixedly held above the conveying support mechanism 20.

The squeegee unit 3 is arranged above the mask 300. The squeegee unit 3 has a function of scraping and spreading the solder fed onto the upper surface of the mask 300 over the upper surface of the mask 300 by reciprocating in the anteroposterior direction (direction Y). Thus, the solder is printed (transferred) onto the surface of the board 200 through the openings of the mask 300. Specifically, the squeegee unit 3 includes a head 31 and a squeegee 32 mounted on a lower portion of the head 31, as shown in FIGS. 1 and 2.

The squeegee unit 3 is supported to be movable in the anteroposterior direction (direction Y) by a pair of rails 7 (see FIG. 1). The squeegee unit 3 is provided with a Y-axis drive motor 33 moving the head 31 in the anteroposterior direction (direction Y).

The head 31 includes a lifting mechanism 34 moving the squeegee 32 vertically and a squeegee rotation mechanism 35 rotating the squeegee 32 using a support shaft 31a as a rotation center. The squeegee 32 is mounted on the head 31 to be rotatable using the support shaft 31a extending in the direction X as a rotation center, as shown in FIG. 2.

The squeegee 32 is formed to extend in the direction X and has a scraping surface (operating surface) 32a to scrape off the solder. The squeegee 32 is so configured that the scraping surface 32a slides in the anteroposterior direction (direction Y) on the upper surface of the mask 300 to scrape off the solder on the upper surface of the mask 300. The squeegee 32 is rotated about the support shaft 31a by the squeegee rotation mechanism 35 to reverse the direction of the scraping surface 32a with respect to the mask 300, whereby advancing printing (printing in a direction Y1 from the back forward) and returning printing (printing in a direction Y2 from before backward) can be performed.

The solder feed portion 4 has a function of feeding the solder printed (transferred) onto the board 200 through the mask 300 onto the mask 300. The solder feed portion 4 is arranged on the front side (Y1 direction side) of the squeegee unit 3 and is mounted on the front side of the head 31 in a state of being movable in the direction X by a feed portion movement mechanism 4a, as shown in FIG. 1. Therefore, the solder feed portion 4 is configured to move in the direction Y integrally with the squeegee unit 3 (squeegee 32) and to be movable in the direction X independently of the squeegee unit 3 (squeegee 32). The solder feed portion 4 can feed the solder while moving along the extensional direction X of the squeegee 32.

Figure 3:
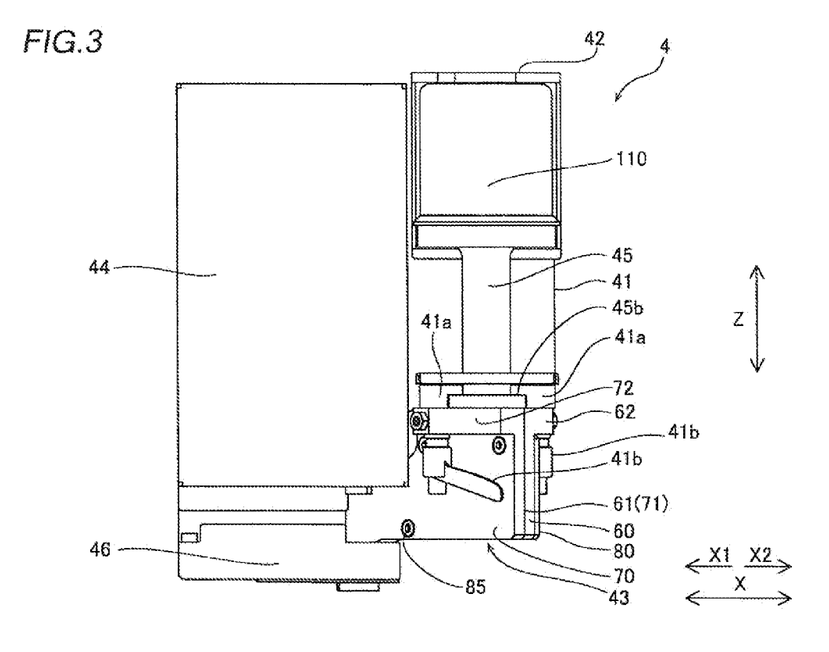
FIG. 3 is a front elevational view showing a solder feed portion of the printer according to the embodiment of the present invention.
Figure 4:
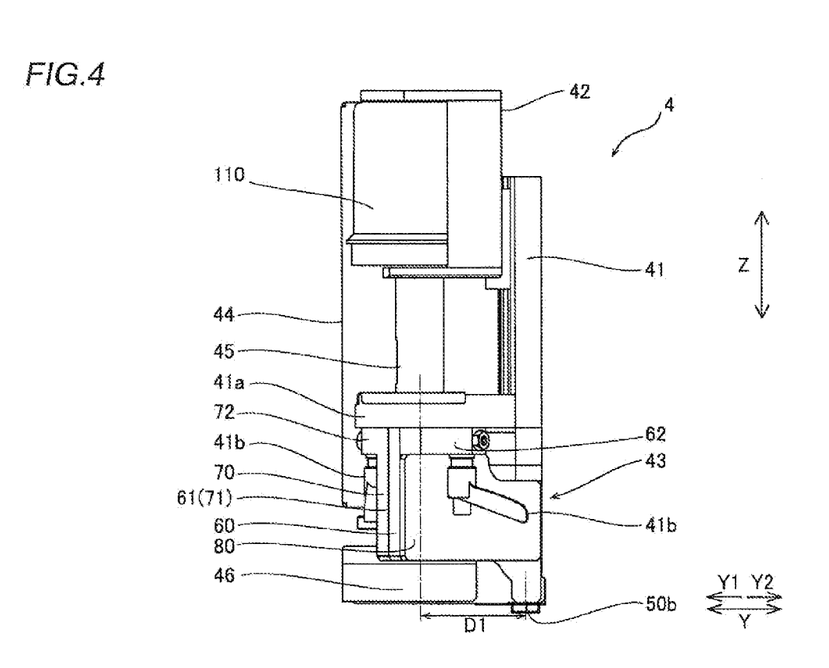
FIG. 4 is a side elevational view of the solder feed portion shown in FIG. 3.
Figure 5:
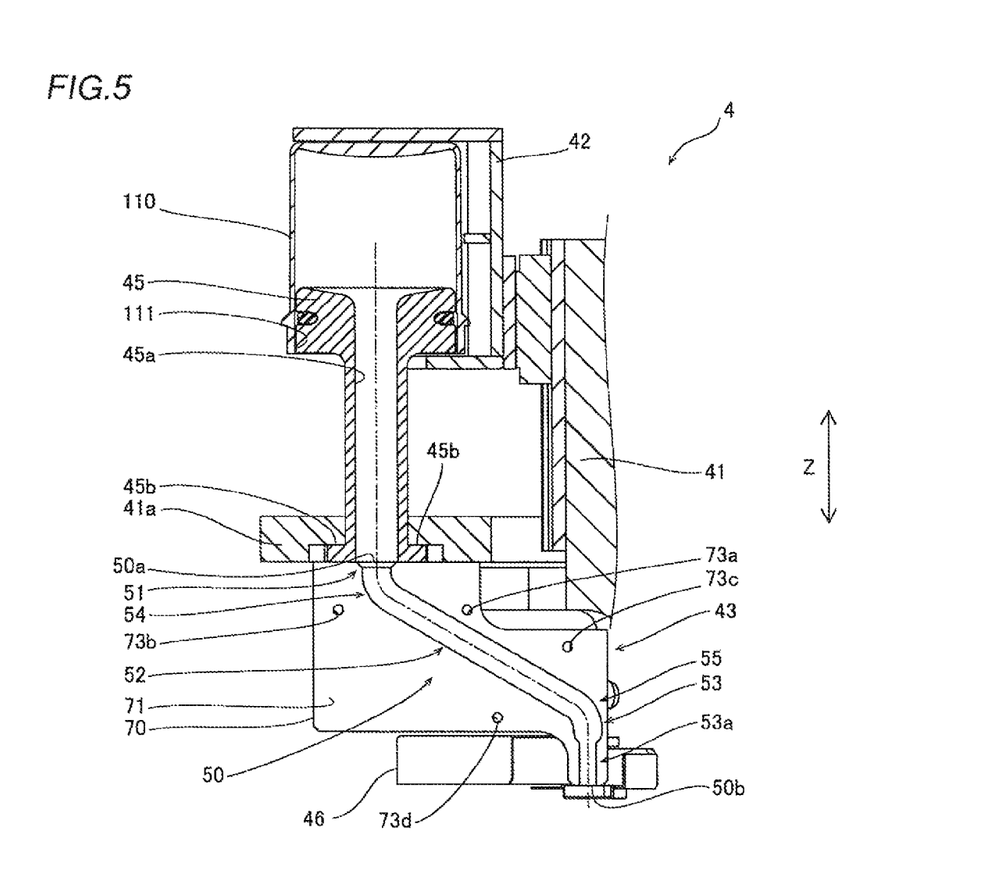
FIG. 5 is a sectional view schematically showing the solder feed portion shown in FIG. 3 taken along a boundary surface of a nozzle.

As shown in FIGS. 3 to 5, the solder feed portion 4 mainly includes a support plate 41, a solder container holding portion 42 holding a solder container 110 in which the solder is stored, a nozzle 43 to discharge the solder stored in the solder container 110, and a feeding mechanism 44 transferring the solder from the solder container 110 to the nozzle 43 and discharging the solder from the nozzle 43. The support plate 41 is supported by the head 31 through the feed portion movement mechanism 4a.

The solder container holding portion 42 is mounted on the support plate 41 in a state of being movable vertically. The solder container holding portion 42 is configured to detachably hold the solder container 110 to which a discharge adapter 45 is attached.

As the solder container 110, a commercially available container distributed in a state of storing a solder paste can be employed. This commercially available solder container 110 has a cylindrical shape including a bottom portion closed at one end and an opening 111 opened at another end, as shown in FIG. 5, for example. The discharge adapter 45 has an outer shape corresponding to the inner shape of the solder container 110 and is configured to be fittable into the solder container 110 from the side of the opening 111. The discharge adapter 45 is tightly attached to (fitted into) the solder container 110 in a state of being slidable along the inner surface of the container. The discharge adapter 45 is formed with a flow path 45a penetrating vertically in a central portion. The flow path 45a is configured to cause the inner portion of the solder container 110 and a feed route 50, described later, of the nozzle 43 to communicate with each other. The discharge adapter 45 and the solder container 110 are so relatively moved that the discharge adapter 45 is inserted into the solder container 110, whereby the solder stored in the solder container 110 is pushed out to the discharge adapter 45 and is discharged through the flow path 45a. The solder container 110 is an example of the "storage portion" in the present invention.

As shown in FIGS. 3 and 4, the feeding mechanism 44 is mounted on the support plate 41 and is configured to lift the solder container holding portion 42 vertically. The feeding mechanism 44 moves (relatively moves) the solder container 110 down to the discharge adapter 45 through the solder container holding portion 42, whereby the solder stored in the solder container 110 is transferred from the flow path 45a of the discharge adapter 45 to the nozzle 43 and is discharged from the nozzle 43 to the mask 300. This feeding mechanism 44 is constituted by a screw feed mechanism including a ball nut (not shown) and a ball screw shaft (not shown) connected to the solder container holding portion 42 and a drive motor (not shown) driving the ball screw shaft to lift the ball nut, a rack-and-pinion mechanism (not shown), or the like, for example.

The nozzle 43 has the bent feed route 50 to guide the solder from the solder container 110 to a tip of the nozzle 43, as shown in FIG. 5. Specifically, the nozzle 43 is so configured that the horizontal position of an exit portion 50b of the feed route 50 is away from the horizontal position of an entrance portion 50a of the feed route 50, as shown in FIGS. 5 to 8. As shown in FIGS. 2 and 4, the nozzle 43 is so mounted on the support plate 41 that the exit portion 50b is closer to the squeegee 32 of the squeegee unit 3 than the entrance portion 50a (see FIG. 5). In other words, the centerline of the exit portion 50b is located a distance D1 away from a centerline (coinciding with the central axis line of the discharge adapter 45) passing through the entrance portion 50a to the squeegee 32 (in the direction Y2). Therefore, a distance D3 in the direction Y between the exit portion 50b and the squeegee 32 (support shaft 31a) is smaller than a distance D2 in the direction Y between the entrance portion 50a and the squeegee 32, as shown in FIG. 2. As shown in FIGS. 3 and 4, the nozzle 43 is arranged to be oblique in a horizontal plane (X-Y plane), and FIG. 5 is an oblique sectional view taken along a boundary surface (61, 71), described later, of the obliquely arranged nozzle 43.

Figure 8:
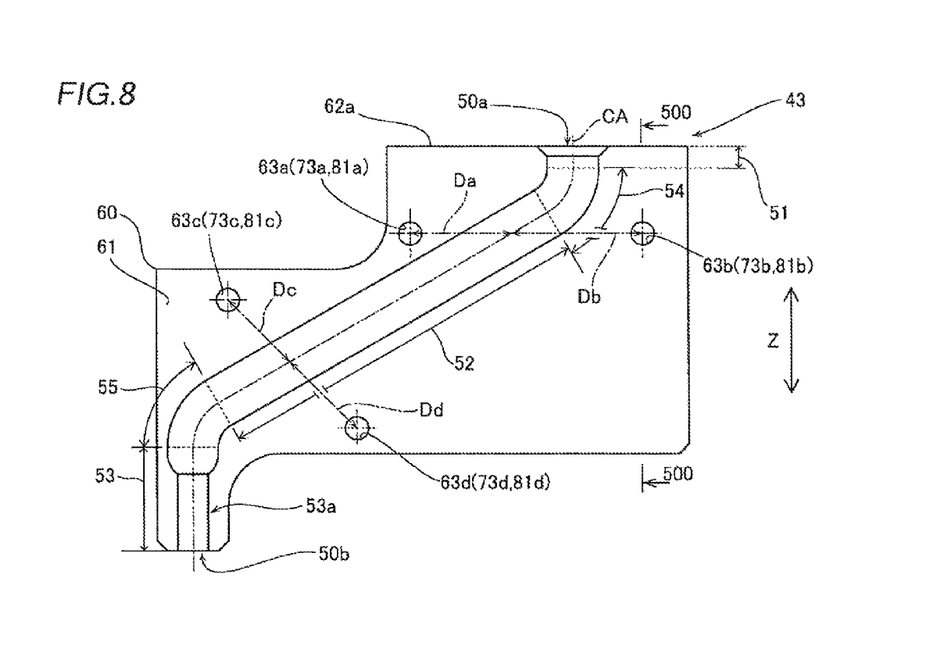
FIG. 8 illustrates a portion on the boundary surface between a first member and a second member of the nozzle shown in FIG. 6.

As shown in FIG. 8, the feed route 50 includes a straight entrance passage portion 51 continuing from the entrance portion 50a, an inclined passage portion 52 connected to the entrance passage portion 51 and inclined with respect to the entrance passage portion 51, and a straight exit passage portion 53 connecting to the exit portion 50b. The cross-sectional surface of the feed route 50 orthogonal to a flow direction is circularly formed. As shown in FIG. 5, the entrance portion 50a of this feed route 50 is connected to an exit-side end portion of the flow path 45a of the discharge adapter 45, and the feed route 50 of the nozzle 43 is communicated with the inner portion (the storage area of the solder) of the solder container 110 through the flow path 45a of the discharge adapter 45. The entrance passage portion 51 is an example of the "straight passage portion" in the present invention.

As shown in FIGS. 5 and 8, the entrance passage portion 51 extends linearly along the feeding direction (vertical direction) of the solder fed from the solder container 110 to the entrance portion 50a. The entrance passage portion 51 has such a shape that an end portion (upper end portion) closer to the entrance portion 50a widens toward the entrance portion 50a (upward). The inclined passage portion 52 linearly extends obliquely downward from a portion (bent portion 54) connecting to the entrance passage portion 51 toward the exit portion 50b. The entrance passage portion 51 and the inclined passage portion 52 are connected by the bent portion 54 formed in a smoothly curved shape (R-shape).

The exit passage portion 53 extends linearly along the discharging direction (vertical direction) of the solder discharged from the exit portion 50b. The inclined passage portion 52 and the exit passage portion 53 are connected by a bent portion 55 formed in a smoothly curved shape (R-shape). The bent portion 54, the inclined passage portion 52, and the bent portion 55 have a constant flow path width (flow path inner diameter). On the other hand, the exit passage portion 53 is formed with a narrow portion 53a whose flow path width (flow path inner diameter) on the side of the exit portion 50b is narrowed. The narrow portion 53a has a function of inhibiting the solder remaining in the feed route 50 after discharge from dropping (dripping) from the exit portion 50b.

Figure 6:
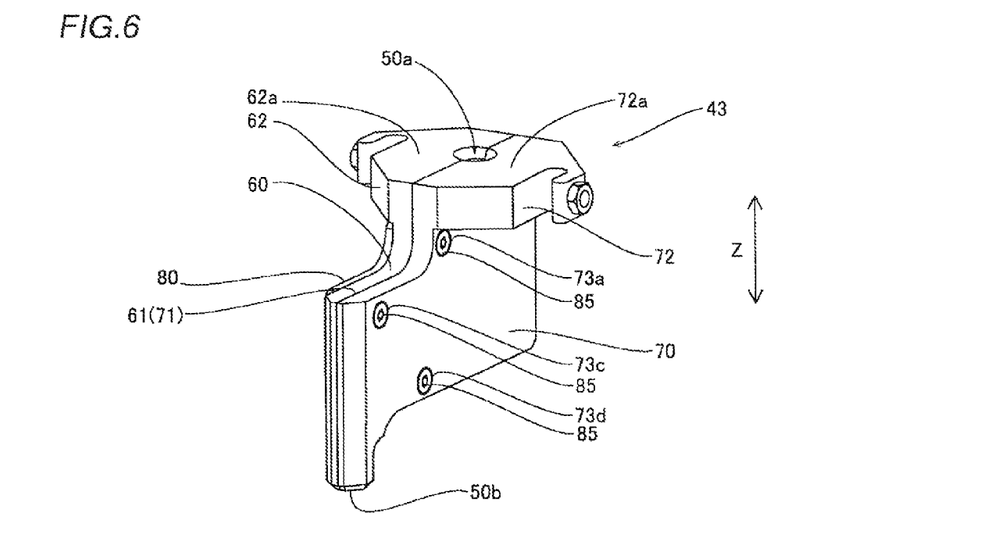
FIG. 6 is a perspective view showing the nozzle of the solder feed portion according to the embodiment of the present invention.
Figure 7:
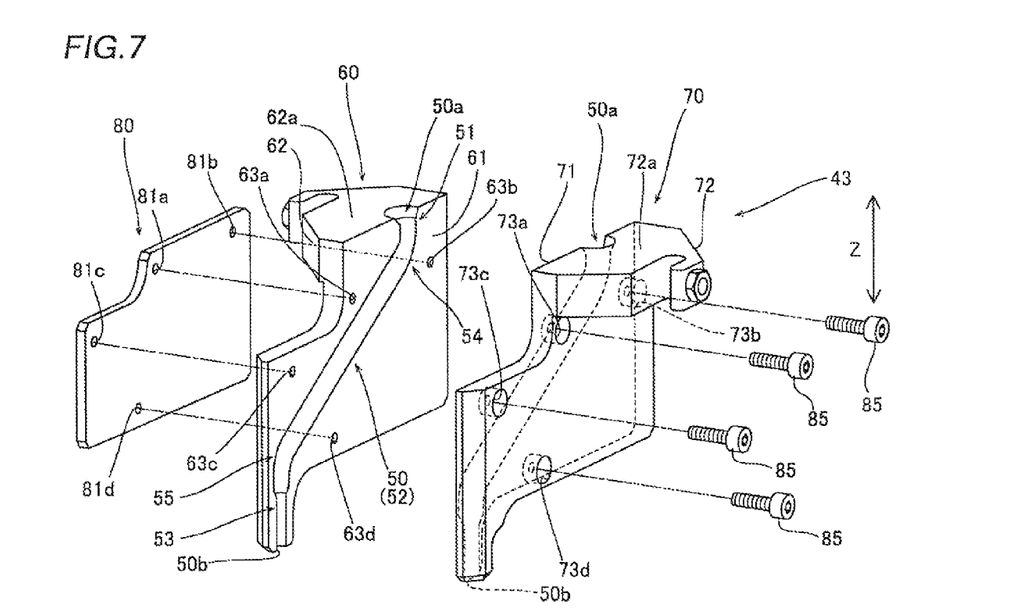
FIG. 7 is an exploded perspective view of the nozzle shown in FIG. 6.

According to this embodiment, the nozzle 43 is configured to be dividable along the bent feed route 50, as shown in FIGS. 6 and 7. Specifically, the feed route 50 constituted by the aforementioned flow path portions is so formed that a central axis line CA (see FIG. 8) passing through the feed route 50 leading from the entrance portion 50a to the exit portion 50b at the tip is arranged in a single plane, and the nozzle 43 is configured to be dividable in half along the feed route 50, using this plane as the boundary surface (61, 71). The boundary surfaces 61 and 71 are examples of the "plane" in the present invention.

Specifically, the nozzle 43 includes a first member 60 and a second member 70 in which a half of the feed route 50 divided by the boundary surface (61, 71) is formed, respectively and a fixing member 80 to attach the first member 60 and the second member 70 to each other and fix the same.

Figure 9:
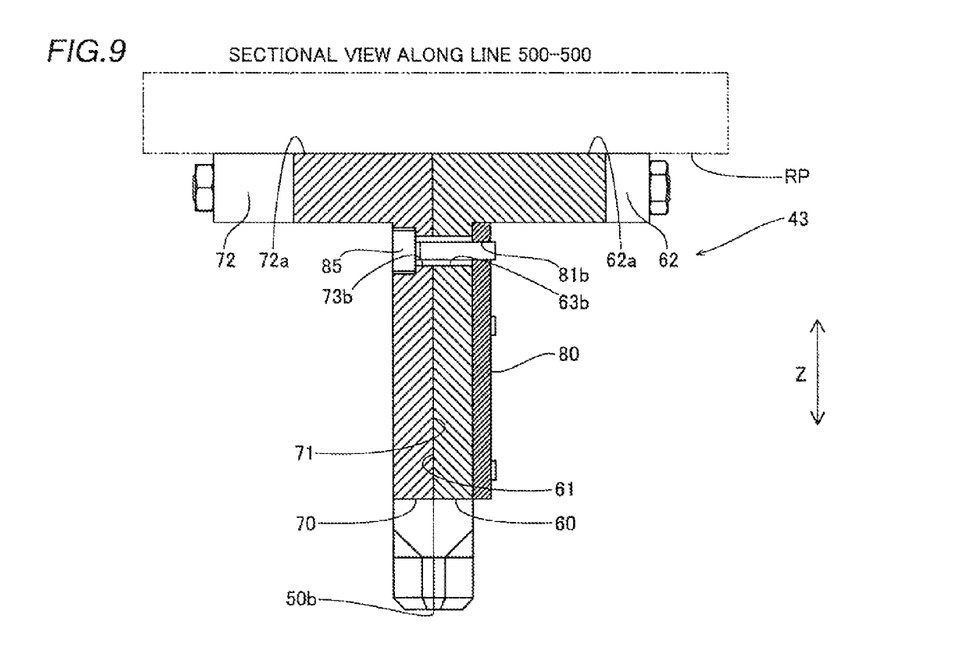
FIG. 9 is a sectional view of the nozzle taken along the line 500-500 in FIG. 8.

The first member 60 has the boundary surface 61 in which a half of the feed route 50 is formed and a flange portion 62 formed to protrude outward (to a side opposite to the boundary surface 61) on the end portion closer to the entrance portion 50a. Similarly, the second member 70 has the boundary surface 71 in which a half of the feed route 50 is formed and a flange portion 72 formed to protrude outward (to a side opposite to the boundary surface 71) on the end portion closer to the entrance portion 50a. The first member 60 is formed with four through-holes 63a, 63b, 63c, and 63d through which screw members 85 pass, and the second member 70 is formed with four through-holes 73a, 73b, 73c, and 73d through which screw members 85 pass. As shown in FIG. 9, the inner diameter of each of these through-holes 63a to 63d and 73a to 73d (FIG. 9 only shows the through-holes 63b and 73b) is larger than the outer diameter of each of the screw members 85. The through-holes 63a to 63d and 73a to 73d are formed with no screw (female screw).

The flange portions 62 and 72 function as engaging portions to fix the nozzle 43 to mounting portions 41a provided on the support plate 41, as shown in FIGS. 3 and 5. As shown in FIGS. 6 and 9, the upper surface 62a of the flange portion 62 and the upper surface 72a of the flange portion 72 are flat surfaces formed to be arranged in the same plane (coplanar) in a state where the first member 60 and the second member 70 are attached to each other. The nozzle 43 is so configured that the mutual positions of the first member 60 and the second member 70 to attach the divided first member 60 and second member 70 to each other by the fixing member 80 are determined in a state where the upper surface 62a of the first member 60 and the upper surface 72a of the second member 70 are brought into contact with a flat reference surface RP (see FIG. 9) such as a surface plate. The upper surfaces 62a and 72a are examples of the "flat surface portion" in the present invention.

The fixing member 80 is arranged outside the first member 60 (on a side opposite to the second member 70), as shown in FIG. 7. The outer surface of the first member 60 closer to the fixing member 80 is flattened, and the fixing portion 80 has a flat plate shape and is formed to come into surface contact with the flat outer surface of the first member 60. The fixing member 80 is formed with four screw holes 81a, 81b, 81c, and 81d formed with female screws. The screw hole 81a corresponds to the through-hole 63a of the first member 60 and the through-hole 73a of the second member 70, the screw hole 81b corresponds to the through-hole 63b and the through-hole 73b, the screw hole 81c corresponds to the through-hole 63c and the through-hole 73c, and the screw hole 81d corresponds to the through-hole 63d and the through-hole 73d.

As shown in FIG. 9, the screw members 85 passing through the through-holes 73a to 73d of the second member 70 and the through-holes 63a to 63d of the first member 60 are screwed into the four screw holes 81a to 81d, respectively. Thus, the screw members 85 screwed into the screw holes 81a to 81d, respectively and the fixing member 80 are tightened, whereby the first member 60 and the second member 70 between the screw members 85 and the fixing member 80 are fixed (attached) to each other.

According to this embodiment, a plurality of (two) pairs of screw holes 81a to 81d of the fixing member 80 are so formed that the screw members 85 are arranged on both sides to sandwich the feed route 50 therebetween, as shown in FIG. 8. In other words, the screw hole 81a (through-holes 63a and 73a) and the screw hole 81b (through-holes 63b and 73b) are formed on both sides to sandwich the feed route 50 therebetween. The screw hole 81c (through-holes 63c and 73c) and the screw hole 81d (through-holes 63d and 73d) are formed on both sides to sandwich the feed route 50 therebetween.

A distance Dc between the screw hole 81c (through-holes 63c and 73c) and the central axis line CA of the feed route 50 and a distance Dd between the screw hole 81d (through-holes 63d and 73d) and the central axis line CA of the feed route 50 are substantially equal to each other. Distances from the screw members 85 to the central axis line CA of the feed route 50 are substantially equal to each other on both sides, whereby fastening force can be evenly exerted on both sides of the feed route 50. The distances from the screw members 85 (screw holes) to the central axis line CA may not be strictly equal to each other. A distance Db between the screw hole 81b (through-holes 63b and 73b) and the central axis line CA of the feed route 50 is slightly larger than a distance Da between the screw hole 81a (through-holes 63a and 73a) and the central axis line CA of the feed route 50.

The nozzle 43 having the aforementioned structure is detachably mounted on the mounting portions 41a of the support plate 41 together with the discharge adapter 45, as shown in FIGS. 3 to 5. Specifically, the mounting portions 41a are arranged (see FIG. 3) on both sides to sandwich the discharge adapter 45 therebetween at the position of the disparage adapter 45 on the exit side and are formed to vertically engage (see FIG. 5) with the upper surface of a flange portion 45b formed on an exit-side end portion of the discharge adapter 45. A pair of clamp lever 41b are provided on the lower surface sides of the mounting portions 41a. The flange portions 62 and 72 of the nozzle 43 and the flange portion 45b of the discharge adapter 45 on the exit side are vertically held between the lower surfaces of the mounting portions 41a and a clamp portion of the clamp lever 41b, whereby the nozzle 43 and the discharge adapter 45 are fixed to the support plate 41.

A shutter mechanism 46 fixed to the support plate 41 is arranged at a position in the vicinity of the exit portion 50b of the nozzle 43. This shutter mechanism 46 is configured to be movable to a position where the exit portion 50b of the nozzle 43 is covered and a position where the exit portion 50b is opened. The shutter mechanism 46 is opened and closed, whereby the start of solder feeding and the stop of solder feeding are controlled and leakage of the solder can be prevented when the solder is not fed.

Second, maintenance of the nozzle 43 of the solder feed portion 4 in the printer 100 according to this embodiment is described with reference to FIGS. 3, 7, and 9.

During the maintenance, clamping of the pair of clamp levers 41b (see FIG. 3) of the solder feed portion 4 is released, whereby the nozzle 43 is detached from the solder feed portion 4. The screw members 85 screwed into the fixing member 80 are removed, whereby the fixing member 80 is detached from the nozzle 43. Then, the nozzle 43 is divided into the first member 60 and the second member 70. Thus, the entire feed route 50 of the nozzle 43 is exposed in a state where the feed route 50 is divided into two halves, as shown in FIG. 7. At this time, the solder remains in the divided feed route 50 in the first member 60 and the second member 70. An operator removes the solder remaining in the divided feed route 50 with a spatula or the like and cleans the feed route 50 with a waste cloth (cleaning cloth) or the like. At this time, even if the remaining solder enters the through-holes (63a to 63d, 73a to 73d), the screws are not inserted into these through-holes (63a to 63d, 73a to 73d) so that the remaining solder can be easily removed. Furthermore, even if the remaining solder hardens in the through-holes, the screw members 85 are not damaged in assembling.

After cleaning is finished, the nozzle 43 is assembled. The first member 60 and the second member 70 are turned upside down, and the upper surface 62a of the first member 60 and the upper surface 72a of the second member 70 are brought into contact with the flat reference surface RP (see FIG. 9) such as a surface plate to position the first member 60 and the second member 70. FIG. 9 shows a state where the first member 60 and the second member 70 are attached to each other, and the first member 60 and the second member 70 are not turned upside down in FIG. 9.

The fixing member 80 is arranged on the outer surface of the first member 60, and the screw members 85 are inserted into the through-holes (63a to 63d, 73a to 73d) from the side of the second member 70. The screw members 85 passing through the through-holes (63a to 63d, 73a to 73d), respectively, are screwed into the screw holes 81a to 81d of the fixing member 80 and are fastened, whereby the first member 60 and the second member 70 are fixed (attached) to each other. Thus, the assembly of the nozzle 43 is completed, and the nozzle 43 is attached to the solder feed portion 4 to finish the maintenance.

Third, the outline of a printing operation of the printer 100 according to this embodiment is described with reference to FIGS. 1 and 10A to 10F.

In the printing operation, the squeegee 32 is rotated, whereby advancing printing and returning printing are performed. When the carried-in board 200 is arranged at the printing position on the lower surface side of the mask 300 by the conveying support mechanism 20 (see FIG. 1), the printing operation is started.

Figure 10A:
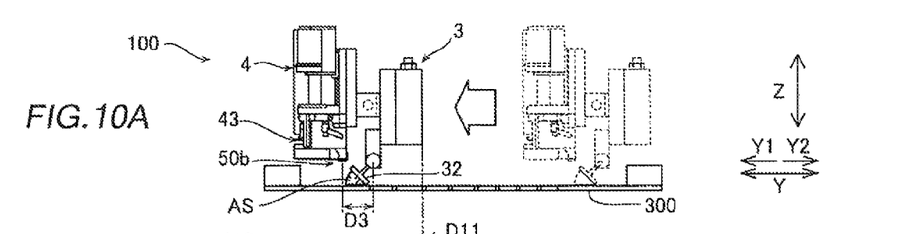
FIGS. 10A to 10F illustrate the outline of a printing operation of the printer according to the embodiment of the present invention.

As shown in FIG. 10A, the squeegee 32 comes into contact with a puddle of the solder AS formed at a prescribed position on the mask 300 from the Y2 direction side, and the squeegee unit 3 moves in the direction Y1 (forward, in an advancing direction). At this time, the squeegee 32 slides on the upper surface of the mask 300 together with the puddle of the solder AS, whereby the openings of the mask 300 are filled up with the solder, and solder printing (advancing printing) is performed on the board 200. The squeegee unit 3 stops at a prescribed position (advancing printing finish position) in the advancing direction where the squeegee 32 passes through the printing area of the mask 300. Thereafter, the board 200 after printing is carried out of the printer 100, and the board 200 before printing is carried in the printer 100 and is arranged at the printing position.

Figure 10B:
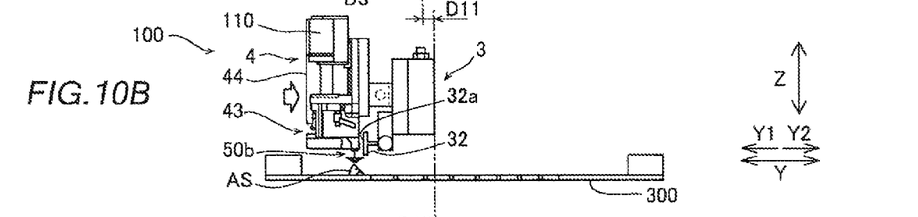

As shown in FIG. 10B, the solder is fed to the puddle of the solder AS. When the solder is fed to the puddle of the solder AS, the squeegee 32 is rotated until the scraping surface 32a of the squeegee 32 becomes perpendicular to the mask 300 in order to avoid interference, the squeegee unit 3 moves backward (in the direction Y2) to a solder feed position, and the exit portion 50b of the nozzle 43 is arranged over the puddle of the solder AS. The feeding mechanism 44 operates to discharge the solder in the solder container 110 from the exit portion 50b of the nozzle 43. At this time, the solder feed portion 4 is moved in the direction X by the feed portion movement mechanism 4a (see FIG. 1), and the solder is evenly fed over the overall width of the puddle of the solder AS corresponding to the width of the squeegee 32. When the amount of reduction in the solder resulting from the advancing printing is less than a prescribed amount, feeding of the solder is skipped.

Figure 10C:
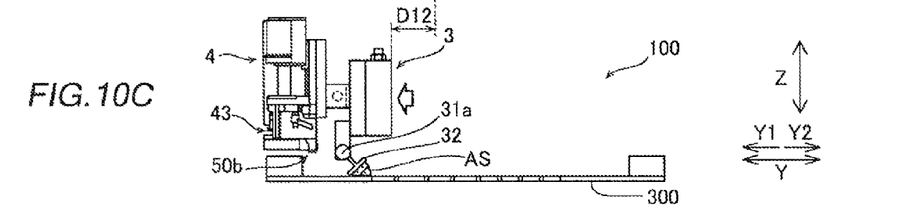

As shown in FIG. 10C, the squeegee 32 is positioned at a prescribed returning printing start position. In other words, the squeegee unit 3 moves forward (in the direction Y1), and the squeegee 32 is rotated to an angle position for returning printing and comes into contact with the puddle of the solder AS on the mask 300 from the Y1 direction side.

Figure 10D:
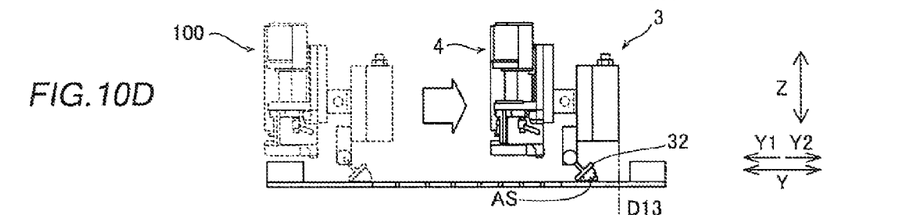

When the squeegee 32 is positioned at the returning printing start position, the squeegee unit 3 moves in the direction Y2 (backward, in a returning direction), and returning printing is performed, as shown in FIG. 10D. The squeegee unit 3 stops at a prescribed position (returning printing finish position) in the returning direction where the squeegee 32 passes through the printing area of the mask 300. Thereafter, the board 200 after printing is carried out of the printer 100, and the board 200 before printing is carried in the printer 100 and is arranged at the printing position.

Figure 10E:
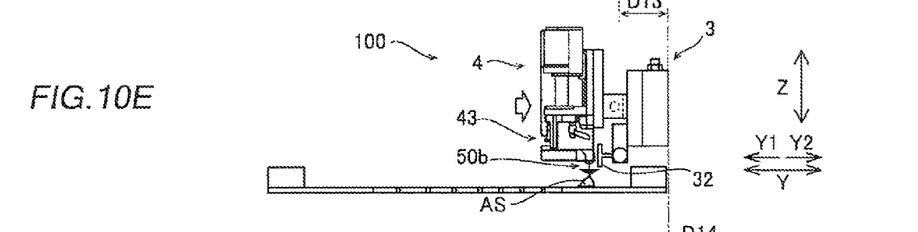

After the returning printing is finished, the squeegee unit 3 moves backward (in the direction Y2) to a solder feed position, and the solder is fed to the puddle of the solder AS, as shown in FIG. 10E. When the amount of reduction in the solder resulting from the returning printing is less than the prescribed amount, feeding of the solder is skipped.

Figure 10F:
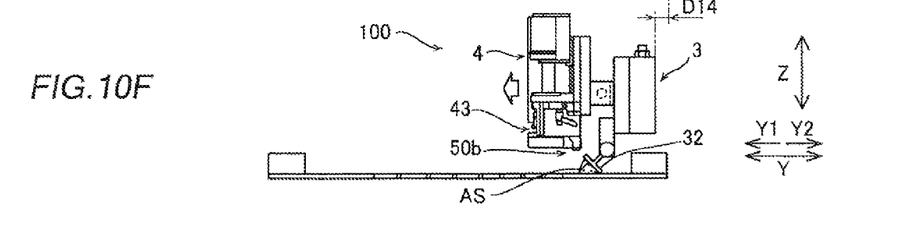

As shown in FIG. 10F, the squeegee 32 is positioned at an advancing printing start position. In other words, the squeegee 32 is rotated to an angle position for advancing printing and comes into contact with the puddle of the solder AS on the mask 300 from the Y2 direction side. Thereafter, the printing operation returns to FIG. 10A, and subsequent advancing printing is performed. The aforementioned operations are repeated, whereby the printing operation of the printer 100 is performed.

According to this embodiment, the exit portion 50b of the nozzle 43 is arranged closer to the squeegee 32 by the distance D1 (see FIG. 2) than the entrance portion 50a, and hence a movement distance D11 from the advancing printing finish position in FIG. 10A to the solder feed position in FIG. 10B and a movement distance D12 from the solder feed position in FIG. 10B to the returning printing start position in FIG. 10C are reduced. Similarly, a movement distance D13 from the returning printing finish position in FIG. 10D to the solder feed position in FIG. 10E and a movement distance D14 from the solder feed position in FIG. 10E to the advancing printing start position in FIG. 10F are reduced.

In other words, when the solder feed portion 4 moves in the direction Y integrally with the squeegee unit 3, the movement distances D11 to D14 from the advancing (returning) printing finish position to the solder feed position and from the solder feed position to the returning (advancing) printing start position are determined depending on a distance D3 in the direction Y from the exit portion 50b of the nozzle 43 to the squeegee 32. Therefore, as compared with a case where the exit portion 50b is at the same position in the direction Y as the entrance portion 50a (a distance from the exit portion 50b to the squeegee 32 is D2 in FIG. 2), for example, the exit portion 50b of the nozzle 43 is closer to the squeegee 32 so that a movement distance associated with solder feeding can be reduced according to this embodiment. Thus, the time required for printing can be reduced.

In a case where the distance D3 from the exit portion 50b to the squeegee 32 is larger, the squeegee 32 may be located over the printing area (area where the openings are formed) of the mask 300 when the solder is fed after the advancing printing is finished, as shown in FIG. 10B. In this case, it is necessary to move the advancing printing finish position in FIG. 10A forward (in the direction Y1) in order to prevent the solder adhering to the squeegee 32 from dropping in the printing area. Therefore, the movement distance of the squeegee 32 in printing is increased. According to this embodiment, the exit portion 50b of the nozzle 43 is closer to the squeegee 32, so that the advancing printing finish position in FIG. 10A can be brought close to the printing area of the mask 300. Thus, the movement distance in printing can be reduced, and the movement range of the squeegee unit 3 in the direction Y can be reduced.

According to this embodiment, as hereinabove described, the printer 100 is provided with the nozzle 43 having the bent feed route 50 to guide the solder from the solder container 110 to the tip of the nozzle 43 and configured to be dividable along the bent feed route 50, whereby during maintenance, the feed route 50 can be cleaned in the state where the nozzle 43 is divided along the bent feed route 50 to expose the feed route 50. Thus, even the feed route 50 having the bent portions (54, 55) can be easily cleaned, and hence cleaning workability in the feed route 50 during maintenance can be improved, and the cleaning state of the feed route 50 can be checked to inhibit the solder from remaining in the feed route 50.

According to this embodiment, the bent portions (54, 55) of the bent feed route 50 of the nozzle 43 each are formed in the smoothly curved shape. Thus, even in the structure of providing the bent feed route 50 in the nozzle 43, the bent portions (54, 55) are not bent sharply so that increase in solder flow resistance in solder feeding can be suppressed. Consequently, even in the structure of providing the bent feed route 50 in the nozzle 43, increase in a load on the feeding mechanism 44 discharging the solder (power necessary to feed the solder) can be suppressed. Furthermore, the bent portions (54, 55) are not bent sharply, and hence corner portions thereof can be easily cleaned. Thus, cleaning workability can be improved.

According to this embodiment, the entrance passage portion 51 is formed to extend along the feeding direction of the solder fed from the solder container 110 to the entrance portion. Thus, in the entrance passage portion 51, the solder can be smoothly injected into the entrance portion 50a (a connection portion between the nozzle 43 and the discharge adapter 45). Furthermore, the inclined passage portion 52 is formed to linearly extend obliquely downward from the portion (bent portion 54) connecting to the entrance passage portion 51 toward the exit portion 50b. Thus, as compared with a case where an arcuate inclined passage portion 52 is provided, for example, a feed path of the solder to the exit portion 50b can be reduced, and hence increase in solder flow resistance with increase in feed path length can be suppressed. In addition, the entrance passage portion 51 and the inclined passage portion 52 are connected by the bent portion 54 formed in the smoothly curved shape. Thus, increase in solder flow resistance in a connection portion between the entrance passage portion 51 and the inclined passage portion 52 can be suppressed.

According to this embodiment, the entrance passage portion 51 is formed in such a shape that the end portion closer to the entrance portion 50a widens toward the entrance portion 50a (upward). Thus, the feed route 50 widens at the entrance portion 50a (the connection portion between the nozzle 43 and the discharge adapter 45), and hence the solder can be more smoothly injected into the entrance portion 50a.

According to this embodiment, the feed route 50 of the nozzle 43 is provided with the exit passage portion 53 extending linearly along the discharging direction (vertical direction) of the solder discharged from the exit portion 50b. In addition, the inclined passage portion 52 and the exit passage portion 53 are connected by the bent portion 55 formed in the smoothly curved shape. Thus, increase in solder flow resistance in a connection portion (bent portion 55) between the inclined passage portion 52 and the exit passage portion 53 can be suppressed. Furthermore, the flow direction of the solder can be aligned with the discharging direction of the solder from the exit portion 50b in the exit passage portion 53, and hence the solder can be smoothly discharged from the exit portion 50b.

According to this embodiment, the nozzle 43 is provided with the first member 60 and the second member 70 divided along the feed route 50 and the fixing member 80 to attach the divided first member 60 and second member 70 to each other. Thus, the feed route 50 can be divided into two parts, and hence cleaning workability in the feed route 50 can be improved. Furthermore, the fixing member 80 is provided separately from the first member 60 and the second member 70, whereby the first member 60 and the second member 70 formed with the feed route 50 can be simplified in structure, and hence cleaning workability in the first member 60 and the second member 70 including the feed route 50 can be improved.

According to this embodiment, the first member 60 and the second member 70 are provided with the through-holes (63a to 63d, 73a to 73d) into which the screw members 85 are inserted. In addition, the fixing member 80 is formed with the screw holes 81a to 81d into which the screw members 85 passing through the through-holes (63a to 63d, 73a to 73d), respectively are screwed. Thus, the first member 60 and the second member 70 are fastened together using the screw members 85 and the fixing member 80, whereby the first member 60 and the second member 70 can be fixed to each other. Furthermore, the solder remaining in the feed route 50 can be prevented from partially entering the screw holes 81a to 81d in cleaning. Consequently, damage of the screw members 85 resulting from the hardened solder entering the screw holes can be prevented, and cleaning workability can be improved.

According to this embodiment, the plurality of (four) screw holes 81a to 81d of the fixing member 80 are so formed in pairs that the screw members 85 are arranged on both sides to sandwich the feed route 50 therebetween. Thus, both sides of the feed route 50 can be evenly fastened by pairs of screw members 85. Therefore, in the structure of dividing the feed route 50 into two parts in the first member 60 and the second member 70, the boundary of the feed route 50 can be tightly fastened by a minimum necessary number of screw members 85.

According to this embodiment, the fixing member 80 is in the form of a flat plate and is configured to come into surface contact with the flat outer surface of the first member 60. Thus, the first member 60 and the fixing member 80 are brought into close contact (surface contact) with each other, whereby the first member 60 and the second member 70 can be strongly fixed to the fixing member 80. Furthermore, the fixing member 80 is in the form of a simple flat plate, whereby assembly and disassembly of the nozzle 43 associated with cleaning can be facilitated.

According to this embodiment, the nozzle 43 is so configured that the mutual positions of the first member 60 and the second member 70 are determined in the state where the upper surfaces (62a, 72a) of the first member 60 and the second member 70 are brought into contact with the flat reference surface RP when the divided first member 60 and second member 70 are attached to each other by the fixing member 8. Thus, the first member 60 and the second member 70 can be easily positioned with a simple structure requiring no positioning member (such as a positioning pin) separately, for example by bringing the upper surfaces (62a, 72a) into contact with the reference surface RP when the first member 60 and the second member 70 are attached to each other.

According to this embodiment, the bent feed route 50 is so formed that the central axis line CA passing through the feed route 50 leading from the entrance portion 50a to the exit portion 50b at the tip is arranged in the single plane, and the nozzle 43 is configured to be dividable in half along the feed route 50, using this plane as the boundary surface (61, 71). Thus, the entire feed route 50 can be divided in half, and hence the feed route 50 can be easily cleaned. The boundary surface (61, 71) of the divided nozzle 43 is plat, and hence the nozzle 43 can be easily formed with high accuracy as compared with a case where the nozzle 43 is so divided that the boundary surface is curved, for example.

The embodiment disclosed this time must be considered as illustrative in all points and not restrictive. The range of the present invention is shown not by the above description of the embodiment but by the scope of claims for patent, and all modifications within the meaning and range equivalent to the scope of claims for patent are further included.

For example, while the solder (cream solder) is shown as the example of the viscous material according to the present invention in the aforementioned embodiment, the present invention is not restricted to this. According to the present invention, the viscous material may alternatively be a conductive paste other than the solder, an adhesive for temporarily attaching a chip, or the like.

While the solder feed portion 4 of the printer 100 including the squeegee 32 is shown as the example of the "viscous material feeder" according to the present invention in the aforementioned embodiment, the present invention is not restricted to this. The present invention may alternatively be applied to a viscous material feeder other than the printer, such as an adhesive dispenser or the like, for example.

While the first member 60 and the second member 70 of the nozzle 43 are fastened with the screw members 85 and the fixing member 80 to be attached to each other in the aforementioned embodiment, the present invention is not restricted to this. According to the present invention, the first member and the second member may alternatively be fastened with the screw members and nuts. However, it is preferable to provide the fixing member 80 formed with the plurality of screw holes as in the aforementioned embodiment since the mutual positions of the four screw members can be accurately set and the screw members can be collectively attached and detached.

While the nozzle 43 is dividable in half along the feed route 50 using the single plane in which the central axis line CA is arranged as the boundary surface (61, 71) in the aforementioned embodiment, the present invention is not restricted to this. According to the present invention, the nozzle may not be divided using the single plane as the boundary surface. For example, the nozzle may alternatively be divided into a left portion and a right portion with respect to the central axis line CA in FIG. 8.

While the nozzle 43 is dividable in half (into two parts) in the aforementioned embodiment, the present invention is not restricted to this. According to the present invention, the nozzle may alternatively be dividable into more than two parts.

While the nozzle 43 is divided in half using the single plane in which the central axis line CA of the feed route 50 is arranged as the boundary surface so that the entire feed route 50 is divided in half in the aforementioned embodiment, the present invention is not restricted to this. According to the present invention, the entire feed route may not be divided.

While the feed route 50 is so configured that the straight passage portions (the entrance passage portion 51, the inclined passage portion 52, and the exit passage portion 53) are connected by the bent portions (54, 55) each formed in the smoothly curved shape in the aforementioned embodiment, the present invention is not restricted to this. According to the present invention, the entire feed route may alternatively be bent in a smoothly curved shape.

While the mutual positions of the first member 60 and the second member 70 are determined in the state where the upper surface 62a of the first member 60 and the upper surface 72a of the second member 70 are brought into contact with the flat reference surface RP in the aforementioned embodiment, the present invention is not restricted to this. According to the present invention, the nozzle may alternatively be so configured that the first member and the second member are positioned by forming a positioning hole passing through the first member and the second member in the nozzle and mounting a positioning pin to the positioning hole, for example without providing the flat surfaces (upper surfaces 62a and 72a) for positioning.

While two pairs of (four) screw members 85 are provided in the aforementioned embodiment, the present invention is not restricted to this. According to the present invention, six or more (three or more pairs of) screw members may alternatively be provided.

While the screw members 85 are arranged on both sides of the feed route 50 in the aforementioned embodiment, the present invention is not restricted to this. According to the present invention, the screw members may not be arranged to sandwich the feed route from both sides of the feed route.

What is claimed is:

1. A viscous material feeder comprising:
   a nozzle to discharge a viscous material stored in a storage portion storing the viscous material; and
   a feeding mechanism transferring the viscous material from the storage portion to the nozzle and discharging the viscous material from the nozzle, wherein the nozzle has a bent feed route to guide the viscous material from the storage portion to a tip of the nozzle and is configured to be dividable along the bent feed route,
   the bent feed route of the nozzle includes a straight passage portion formed in a linear manner and continuing from an entrance portion of the bent feed route and an inclined passage portion connected to the straight passage portion and inclined with respect to the straight passage portion,
   the inclined passage portion has a circularly cross-sectional surface and a constant flow path width, and linearly extends obliquely downward from a portion connecting to the straight passage portion toward an exit portion of the bent feed route.

2. The viscous material feeder according to claim 1, wherein
   a bent portion of the bent feed route of the nozzle is formed in a smoothly curved shape.

3. The viscous material feeder according to claim 2, wherein
   the straight passage portion extends along a feeding direction of the viscous material fed from the storage portion to the entrance portion.

4. The viscous material feeder according to claim 3, wherein
   the straight passage portion has such a shape that an end portion thereof closer to the entrance portion widens toward the entrance portion.

5. The viscous material feeder according to claim 2, wherein
   the straight passage portion and the inclined passage portion are connected by the bent portion formed in the smoothly curved shape.

6. The viscous material feeder according to claim 2, wherein
   the bent feed route of the nozzle further includes an exit passage portion extending linearly along a discharging direction of the viscous material discharged from the exit portion, and
   the inclined passage portion and the exit passage portion are connected by the bent portion formed in the smoothly curved shape.

7. The viscous material feeder according to claim 1, wherein
   the nozzle includes a first member and a second member divided along the bent feed route and a fixing member arranged outside the first member or the second member to attach the divided first and second members to each other.

8. The viscous material feeder according to claim 7, wherein
   each of the first member and the second member has through-holes into which screw members are inserted, and
   the fixing member is formed with screw holes into which the screw members passing through the through-holes of each of the first member and the second member are screwed.

9. The viscous material feeder according to claim 8, wherein a plurality of the screw holes of the fixing member are so formed in pairs that the screw members are arranged on both sides to sandwich the bent feed route therebetween.

10. The viscous material feeder according to claim 7, wherein
the first member has a flat outer surface, and
the fixing member has a flat plate shape and is configured to come into surface contact with the flat outer surface of the first member.

11. The viscous material feeder according to claim 7, wherein
the first member and the second member have flat surface portions arranged in a same plane in a state where the first member and the second member are attached to each other, respectively, and
the nozzle is so configured that mutual positions of the first member and the second member are determined in a state where the flat surface portions of the first member and the second member are brought into contact with a flat reference surface when the divided first and second members are attached to each other by the fixing member.

12. The viscous material feeder according to claim 1, wherein
the bent feed route is so formed that a bent central axis line passing through the bent feed route leading from the entrance portion to the exit portion at the tip is arranged in a single plane, and
the nozzle is configured to be dividable in half along the bent feed route, using the single plane as a boundary.

13. The viscous material feeder according to claim 1, further comprising a discharge adapter including a flow path causing an inner portion of the storage portion storing the viscous material and the bent feed route of the nozzle to communicate with each other, wherein
the feeding mechanism is configured to relatively move the discharge adapter and the storage portion to transfer the viscous material stored in the storage portion to the nozzle configured to be dividable through the discharge adapter.

14. The viscous material feeder according to claim 1, wherein
the viscous material includes one of a cream solder, a conductive paste, and an adhesive for temporarily attaching a chip.

15. A viscous material printer comprising:
a viscous material feed portion including a nozzle to discharge a viscous material stored in a storage portion storing the viscous material and a feeding mechanism transferring the viscous material from the storage portion to the nozzle and discharging the viscous material from the nozzle; and
a squeegee scraping off the viscous material fed by the viscous material feed portion, wherein
the nozzle of the viscous material feed portion has a bent feed route to guide the viscous material from the storage portion to a tip of the nozzle and is configured to be dividable along the bent feed route,
the bent feed route of the nozzle includes a straight passage portion formed in a linear manner and continuing from an entrance portion of the bent feed route and an inclined passage portion connected to the straight passage portion and inclined with respect to the straight passage portion,
the inclined passage portion has a circularly cross-sectional surface and a constant flow path width, and linearly extends obliquely downward from a portion connecting to the straight passage portion toward an exit portion of the bent feed route.

16. The viscous material printer according to claim 15, wherein
a bent portion of the bent feed route of the nozzle is formed in a smoothly curved shape.

17. The viscous material printer according to claim 15, wherein
the nozzle includes a first member and a second member divided along the bent feed route and a fixing member arranged outside the first member or the second member to attach the divided first and second members to each other.

18. The viscous material printer according to claim 17, wherein
each of the first member and the second member has through-holes into which screw members are inserted, and
the fixing member is formed with screw holes into which the screw members passing through the through-holes of each of the first member and the second member are screwed.

19. The viscous material printer according to claim 15, wherein
the bent feed route is so formed that a bent central axis line passing through the bent feed route leading from the entrance portion to the exit portion at the tip is arranged in a single plane, and
the nozzle is configured to be dividable in half along the bent feed route, using the single plane as a boundary.

* * * * *